United States Patent [19]
Giewont et al.

[11] Patent Number: 5,518,958
[45] Date of Patent: May 21, 1996

[54] PREVENTION OF AGGLOMERATION AND INVERSION IN A SEMICONDUCTOR POLYCIDE PROCESS

[75] Inventors: Kenneth J. Giewont; Anthony J. Yu, both of Poughquag, N.Y.

[73] Assignee: International Business Machines Corporation, Armonk, N.Y.

[21] Appl. No.: 282,681

[22] Filed: Jul. 29, 1994

[51] Int. Cl.⁶ .................................................. H01L 21/44
[52] U.S. Cl. ........................ 437/186; 437/192; 437/200
[58] Field of Search ................................... 437/186, 192, 437/193, 196, 200

[56] References Cited

U.S. PATENT DOCUMENTS

| | | | |
|---|---|---|---|
| 4,180,596 | 12/1979 | Crowder et al. | 427/42 |
| 4,830,971 | 5/1989 | Shibata | 437/29 |
| 4,872,380 | 11/1988 | Shankar et al. | 357/71 |
| 4,927,505 | 5/1990 | Sharma et al. | 204/34.5 |
| 5,164,333 | 11/1992 | Schwalke et al. | 437/200 |
| 5,196,360 | 3/1993 | Doan et al. | 437/41 |
| 5,341,016 | 8/1994 | Prall et al. | 257/412 |
| 5,364,803 | 11/1994 | Lur et al. . | |
| 5,449,631 | 9/1995 | Giewont et al. . | |

FOREIGN PATENT DOCUMENTS

| | | |
|---|---|---|
| 0173872 | 9/1985 | Japan . |
| 3292729 | 12/1991 | Japan . |
| 3-292729 | 12/1991 | Japan . |

OTHER PUBLICATIONS

A. Nishiyama et al. "A Thermally Stable Salicide Process Using $N_2$ Implantation into $TiSi_2$" Jun. 1990 VMIC Conf. pp. 310–316.

Nishiyama, A., et. al., "A Thermally Stable Salicide Process Using $N_2$ Implantation Into $TiSi_2$", Jun. 12–13, 1990, VMIC Conf., pp. 310–316.

Georgiou, G. E., et al., "Thermal Stability Limits of Thin $TiSi_2$", J. Electrochem, Soc., vol. 141, No. 5, May 1994, pp. 1351–1356.

Lasky, J. B., et al., "Comparison of Transformation to Low–Resistivity Phase and Agglomeration of $TiSi_2$ and $CoSi_2$", IEEE Transactions on Electron Devices, vol. 38, No. 2, Feb. 1991, pp. 262–269.

Primary Examiner—George Fourson
Assistant Examiner—C. Everhart
Attorney, Agent, or Firm—Alison D. Mortinger; Richard Lau

[57] ABSTRACT

Conductors are fabricated by forming a layer of doped polysilicon on a semiconductor substrate, forming a nitrogen-enriched conductive layer on the layer of doped polysilicon, wherein nitrogen contained in the nitrogen-enriched conductive layer provides for improved thermal stability thereof, and patterning the nitrogen-enriched conductive layer and layer of doped polysilicon so as to form the conductors.

12 Claims, 3 Drawing Sheets

ISOTHERMAL ANNEALING AT 1050 C
ROOM TEMPERATURE SHEET RESISTANCE

PREVENTION OF AGGLOMERATION AND INVERSION IN A SEMICONDUCTOR POLYCIDE PROCESS

RELATED U.S. PATENT APPLICATIONS

This application is related to commonly assigned, simultaneously filed, U.S. patent application Ser No. 08/282,680, now U.S. Pat. No. 5,449,631.

TECHNICAL FIELD

The present invention relates generally to semiconductor processes and, more particularly, to semiconductor polycide processes and, even more particularly, to prevention of agglomeration and inversion in a semiconductor polycide process.

BACKGROUND OF THE INVENTION

The use of advanced semiconductor lithography and etching processes has enabled reduction in the dimensions of semiconductor devices and a concomitant increase in device operating speed. However, this reduction in dimensions causes a corresponding decrease in the cross-sectional area of interconnect regions, thus leading to an increase in interconnection time delay resulting from both material and circuit parameters. A solution to the increase in interconnection time delay is to place a metal silicide layer on top of a doped polycrystalline silicon in order to lower the sheet resistance of the polycrystalline silicon interconnections and gain increased circuit speed. See, for example, U.S. Pat. No. 4,180,596, issued Dec. 25, 1979 to Crowder et al.

In a polycide process, a silicide conductor in the CMOS gate is deposited at the stoichiometric composition on unpatterned doped polysilicon. In this process, an amorphous silicide followed by deposition of an insulating layer is deposited on the blanket polysilicon. The wafer is then patterned and heated to convert the amorphous silicide gate conductor into a crystalline silicide with low resistivity. After deposition of insulating sidewall spacers, the source and drain regions are then silicided.

Addition of the metal silicide layer lowers the sheet resistance and thereby increases the circuit speed. However, for the reasons outlined hereinbelow, it is necessary for the metal silicide to demonstrate thermal stability during subsequent annealing.

A key technological problem is the agglomeration of metal silicide upon high temperature annealing, i.e., annealing at temperatures greater than approximately 800 degrees C. Agglomeration is a condition in which the metal silicide film has discontinuities caused by silicon diffusion and grain growth. At elevated temperatures, silicon within and under the metal silicide diffuse and eventually coalesce to form large silicon grains which break the continuity of the original metal silicide film. Accordingly, a narrow conductor constructed with an agglomerated silicide tends to show a significant increase in average sheet resistance. In this regard, localized breaks in the film can have very high resistance if the silicide is completely severed across the width of the line. As such, in high speed circuit applications requiring low resistance silicide conductors, agglomeration can result in performance degradation or total functional failure.

An objective in device manufacturing processing is therefore to identify a thermal process window in which the low resistance silicide will form and not agglomerate. This process window must be large enough to accommodate temperature and time variations without resulting in incomplete silicide conversion or agglomeration. The problem is highlighted, for example, when forming titanium silicide ($TiSi_2$) on P+ doped polysilicon. The activation energy for forming low resistivity C54 $TiSi_2$ on P+ doped polysilicon is higher than for forming low resistivity C54 $TiSi_2$ on undoped polysilicon, and this increased activation energy causes the manufacturing process window to shrink even further.

A related thermal stability problem of silicide conductors occurs specifically on poly/polycide conductors which are used for gates on N-type or P-type MOS transistors. Upon high temperature anneals, the condition of agglomeration can extend to a condition referred to as "inversion" in which the silicide and underlying polysilicon exchange position. At high temperatures, silicon and silicide diffuse in opposite directions which eventually results in the silicide coming into contact with the thin gate silicon oxide of the MOS device. The metals in the silicide tend to poison, i.e., cause deterioration of, the gate oxide which results in a lowering of the dielectric breakdown and eventual current leakage upon applied voltage. This quickly leads to device and circuit failure at high speed or DC applications. In this regard, physical analysis of $TiSi_2$ polycide conductors revealed the presence of the C49 $TiSi_2$ phase at the failing sites. This suggests that incomplete conversion to the low resistance C54 phase can aid the inversion process at high temperature. Agglomeration and inversion are conditions which usually occur together, with the latter occurring at higher and/or longer anneal temperatures.

Current ULSI manufacturing processes utilize Rapid Thermal Annealing (RTA) to widen the process window for low resistivity silicide films by allowing the use of high temperature and shorter annealing times. The higher annealing temperatures attainable with RTA change the rate of transformation and improve the formation of low resistance silicide. Shorter annealing times decrease the tendencies for agglomeration. A limitation to RTA, however, is that as linewidths and diffusions are decreased below 0.5 um, the process window for low resistivity silicide formation without agglomeration disappears.

Other manufacturing processes have increased the thickness of silicide film to suppress the tendency of the film to agglomerate. However, for geometries below 0.5 um, a greater thickness of silicide film presents an aggressive aspect ratio that challenges the abilities of the subsequent insulator fill deposition.

Still other manufacturing processes rely on limiting the annealing temperature to below 850 degrees C. and limiting the overall thermal budget.

Accordingly, it is desirable to promote the formation of low resistance silicides and prevent agglomeration of the film during high temperature annealing. Furthermore, a method of manufacturing a silicide structure is necessary such that the metal atoms of a refractory metal or metal silicide are prevented from diffusing through the polysilicon and into the gate oxide during subsequent heat treatments.

SUMMARY OF THE INVENTION

Thus, it is an object of the present invention to provide an improved semiconductor polycide process.

Another object of the present invention is to provide an improved semiconductor polycide process for forming a gate electrode.

A further object of the present invention is to provide a semiconductor polycide process which results in a metal silicide film having increased thermal stability.

Still another object of the present invention is to inhibit the disruption of metal silicide and thereby inhibit the increase of sheet resistance of the thin film due to agglomeration.

Yet another object of the present invention is to provide a semiconductor polycide process which prevents the occurrence of inversion.

In order to accomplish the above and other objects of the present invention, a method of fabricating a conductor includes the steps forming a layer of doped polysilicon on a semiconductor substrate, forming a nitrogen-enriched conductive layer on the layer of doped polysilicon, wherein nitrogen contained in the nitrogen-enriched conductive layer provides for improved thermal stability thereof, and patterning the nitrogen-enriched conductive layer and layer of doped polysilicon so as to form a conductor.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENT

Figure 1A:
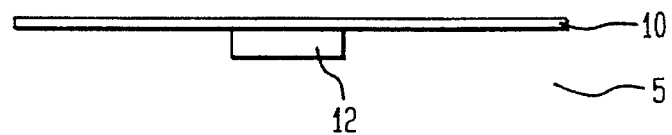
FIGS. 1A–1E show process steps for fabrication of a gate electrode structure using a semiconductor polycide process in accordance with the present invention.
Figure 1B:
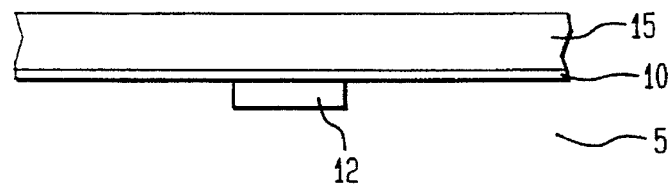
Figure 1C:
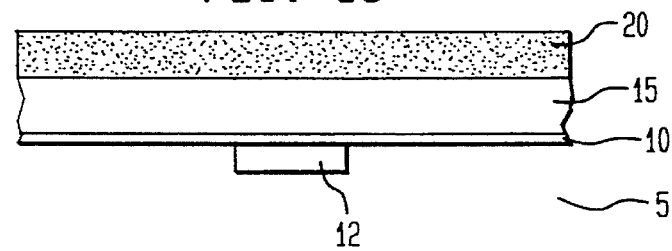
Figure 1D:
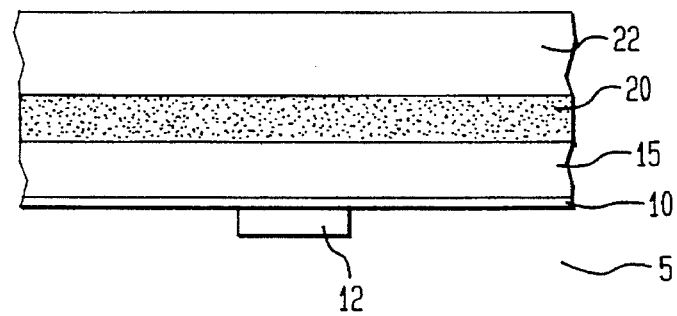
Figure 1E:
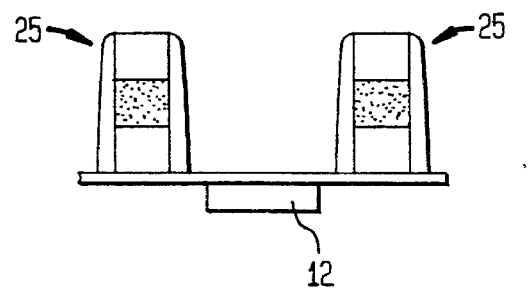

Referring to FIGS. 1A–E, conventional ion implantation is conducted on a substrate 5 to control threshold voltages, and a gate oxide film 10 is then formed on the substrate 5. The gate oxide film 10 has a thickness, for example, of approximately 80'100 A. As required, an isolation 12 can also be conventionally formed in the substrate 5 for the purpose of separating devices. In the next step, a polysilicon layer 15 is deposited to a thickness of approximately 100–200 nm, followed by conventional ion implantation (arsenic or phosphorus for N+, or boron for P+) to concentrations so as to stabilize the work-function. The implanted polysilicon layer 15 is then annealed at a temperature on the order of, for example, 900 degrees C. to distribute and activate the dopants therein.

Next, in accordance with the present invention, a nitrogen-enriched conductive layer, such as a nitrogen-enriched metal silicide layer 20, is formed on the polysilicon layer 15. Preferably, in order to provide for a thermally stable nitrogen-enriched metal silicide layer 20 for realizing the benefits of inhibited agglomeration and inversion during later annealing, it has been found that the nitrogen-enriched metal silicide layer 20 should have between approximately 1% and 3% of nitrogen contained therein. Note that although the metal silicide layer 20 is used as a specific example for the conductive layer, certain applications may require that, in lieu of the metal silicide layer 20, a refractory metal layer be formed on the polysilicon layer 15. Thus, for such applications, the metal silicide layer 20 can be replaced by a refractory metal layer comprising, for example, W, Ti, or Ta, and such refractory metal layer can also be nitrogen-enriched in accordance with the present invention.

In a preferred embodiment, the nitrogen-enriched metal silicide layer 20 is formed by sputter depositing. In accordance with the invention, nitrogen is incorporated with sputter process plasma to form a nitrogen-enriched sputter process plasma. The sputter deposition process then proceeds with bombardment of a metal silicide target (or other conductive target, as may be appropriate) with ions from the nitrogen-enriched sputter process plasma to displace molecules from the metal silicide target. This causes nitrogen from the nitrogen-enriched sputter process plasma to be incorporated with the molecules displaced from the metal silicide target to form the nitrogen-enriched metal silicide layer 20.

From a perspective of manufacturability, the addition or incorporation of nitrogen to a sputter process plasma can be accomplished as described hereinbelow. A conventional DC magnetron sputter deposition tool can be used, and argon plasma is typically used as the sputter process plasma. The nitrogen can be provided through a calibrated mass flow controller. Typical sputtering conditions may include 2220 Watts (DC) power at a sputtering plasma pressure of approximately 6 milliTorr, and a wafer chuck temperature set in the range of 100 to 300 degrees C. To incorporate between approximately 1% and 3% of nitrogen in the resulting metal silicide film, between approximately 0.5% and 3% of nitrogen is mixed with the sputter process argon plasma during the sputtering process to form an argon-nitrogen plasma. The argon-nitrogen plasma can be ignited under the same conditions as the argon plasma. The resultant formation of a non-deposited nitrogen-enriched metal silicide shows uniformities of 1% across 200 mm wafers. Proper conditions show uniform nitridation to a level of 1–3 atomic % nitrogen in silicide lead to a stable silicide film during high temperature (1050 degrees C.) annealing.

The resulting laminate structure can then be conventionally capped with a dielectric film 22 and patterned with photoresist. The gate electrode structures 25 (one or more, as required) are then formed by conventional anisotropic etching.

Subsequently, conventional process steps can be used to complete the device. Such process steps may include passivating the sidewalls of the gate electrode structures 25 with spacers, implantation of the source and drain regions, and heat treatment to drive in the dopants.

For test structures that simulate the high density of gate conductor lines used in VLSI semiconductor memory chips, sheet resistance was measured on various lines of 1 um to 0.4 um in linewidth and 1.3 um to 0.4 um in spacing. Table 1 shows the resultant yield as a function of the amount of nitrogen in the gas. A failed line is one with a sheet resistance (100 nm $TiSi_2$) of greater than 3 ohms/square. The average sheet resistance for a nitrogen-sputtered $TiSi_2$ line was 1.8 ohms/square.

TABLE 1

| % Nitrogen | Lines Tested | Lines Failed | % Failed |
| --- | --- | --- | --- |
| 0.0 | 1750 | 61 | 3.5 |
| 0.1 | 1800 | 35 | 1.9 |

TABLE 1-continued

| % Nitrogen | Lines Tested | Lines Failed | % Failed |
|---|---|---|---|
| 0.5 | 1800 | 3 | 0.16 |
| 1.0 | 1800 | 0 | 0.0 |

Figure 2:
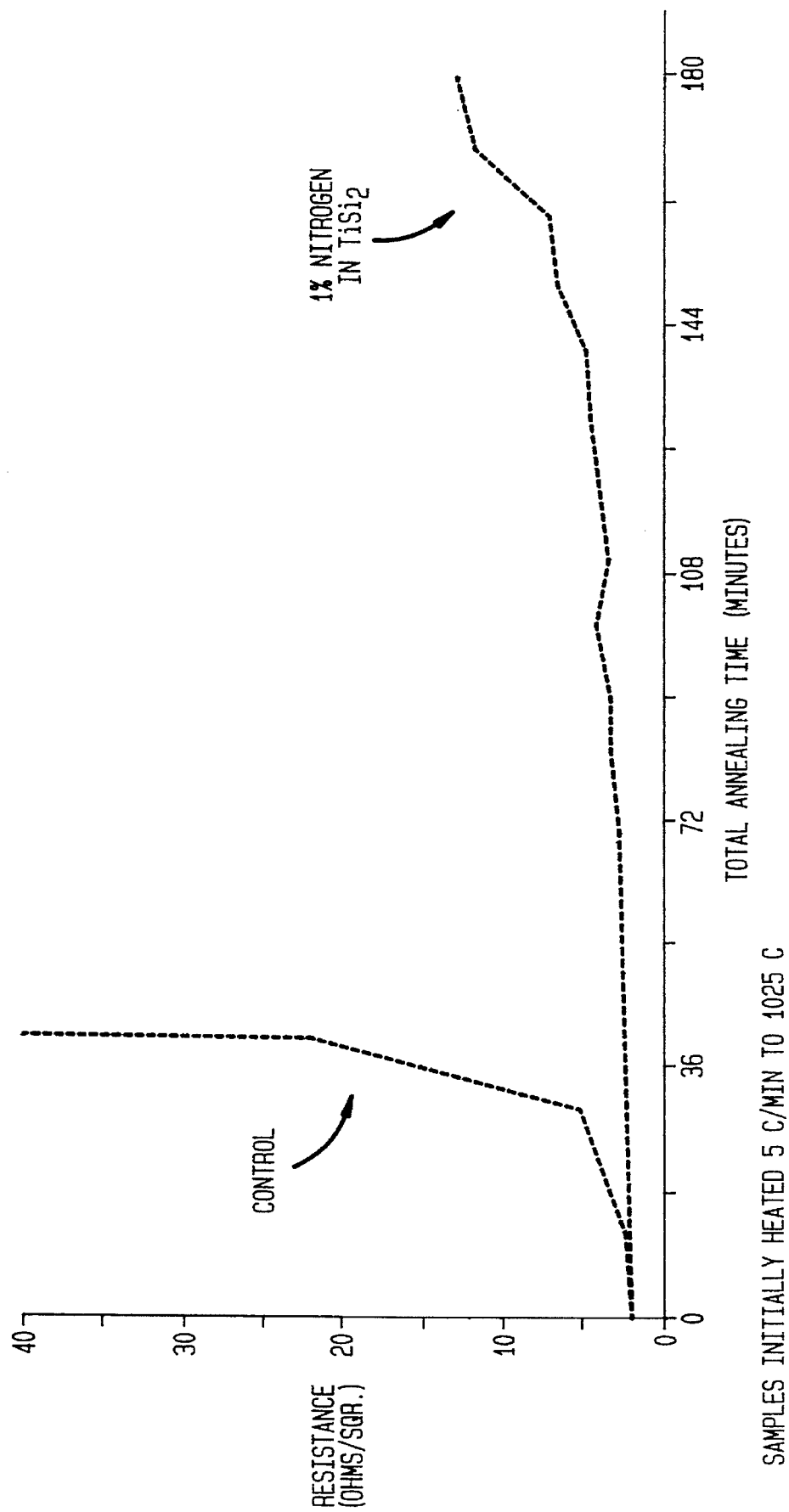
FIG. 2 is a plot of total annealing time vs. resistance to demonstrate thermal stability of a metal silicide film fabricated in accordance with the present invention as compared to a Control film.

The nitrogen that is incorporated in the silicide film during sputter deposition functions to stabilize the silicide during extended high temperature annealing. FIG. 2 demonstrates that the resistance of a 100 nm $TiSi_2$ film without nitrogen ("Control") begins to quickly increase due to the thermal agglomeration of the silicide film. The same thickness of $TiSi_2$ with 1.0% nitrogen incorporated throughout the film shows less agglomeration and displays a more robust process window at high temperature (1050 degrees C.). Silicide inversion is completely suppressed for silicide films formed in accordance with the present invention. The addition of nitrogen to the silicide is thus shown to improve the thermal stability of the silicide film.

Figure 3A:
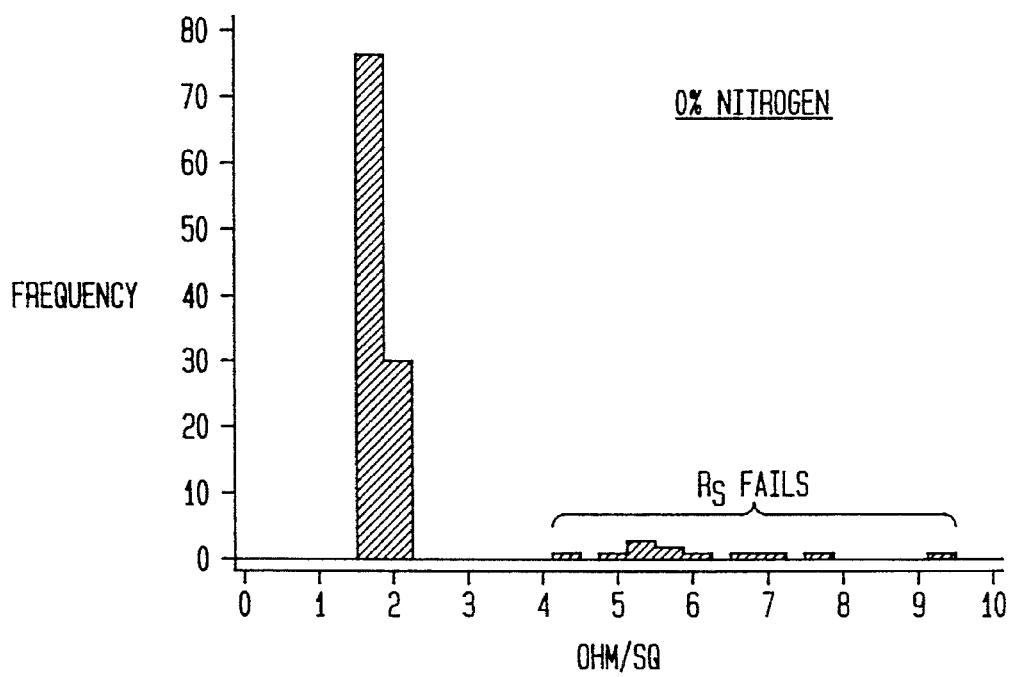
FIGS. 3A–3B are plots which indicate the frequency of sheet resistance fails for gate conductors fabricated with metal silicide films having no nitrogen incorporated therein, and for gate conductors fabricated with metal silicide films having 1% nitrogen incorporated therein, respectively.
Figure 3B:
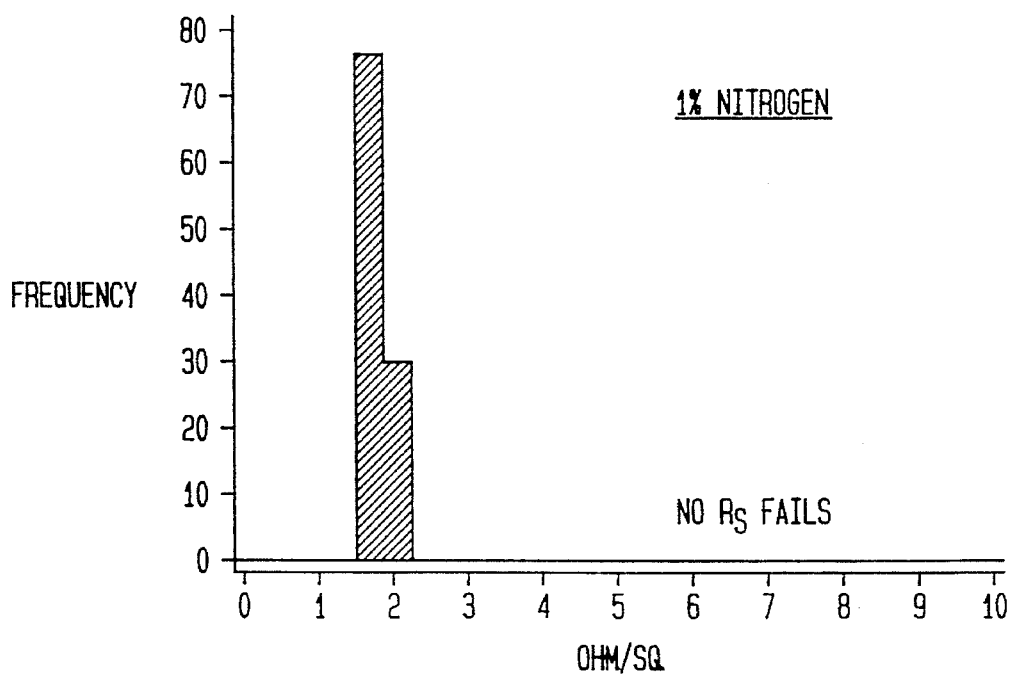

FIGS. 3A–B demonstrate that with a dose of 1% nitrogen, as compared to 0% nitrogen, the $TiSi_2$ agglomeration is controlled without decomposition of the silicide film into high resistance TiN and Si. It is readily apparent that the overall distribution of the sheet resistance, $R_s$, is lowered by the addition of the 1% of nitrogen, as the signature of the sheet resistance, $R_s$, of the nitrogen-enriched silicide lacks the high resistance tail in distribution, the $R_s$ fails, that is demonstrated in the silicide lacking the nitrogen.

Those skilled in the art will appreciate that, in addition to usefulness in fabricating CMOS gate electrode structures as described hereinabove, the present invention is broadly applicable to fabrication of any integrated conductor which requires a polysilicon/metal silicide stack having increased thermal stability. Such applications may include bipolar, BiCMOS or SOI (silicon-on-insulator) applications, and may also include conductors fabricated for the interconnection of various discrete devices.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of fabricating a conductor, comprising the steps of:

(a) providing a semiconductor substrate;

(b) forming a layer of doped polysilicon on said semiconductor substrate;

(c) forming a nitrogen-enriched conductive layer on said layer of doped polysilicon, said nitrogen-enriched conductive layer including between approximately 1% and 3 atomic % of nitrogen, said nitrogen contained in said nitrogen-enriched conductive layer providing improved thermal stability thereof including inhibition of agglomeration and inversion; and (d) patterning said nitrogen-enriched conductive layer and layer of doped polysilicon to form a conductor.

2. A method according to claim 1, wherein said nitrogen-enriched conductive layer comprises a nitrogen-enriched metal silicide.

3. A method according to claim 1, wherein said nitrogen-enriched conductive layer comprises a nitrogen-enriched refractory metal.

4. A method according to claim 1, wherein step (c) comprises sputter depositing using a sputter process plasma.

5. A method according to claim 4, further comprising the step of incorporating nitrogen into said sputter process plasma to form a nitrogen-enriched sputter process plasma.

6. A method according to claim 4, wherein said sputter process plasma includes argon.

7. A method of fabricating a gate electrode structure of a semiconductor device, comprising the steps of:

(a) providing a semiconductor substrate;

(b) forming a gate oxide film on said semiconductor substrate;

(c) forming a layer of doped polysilicon on said gate oxide film;

(d) forming a nitrogen-enriched conductive layer on said layer of doped polysilicon, said nitrogen-enriched conductive layer including between approximately 1% and 3 atomic % of nitrogen, said nitrogen contained in said nitrogen-enriched conductive layer providing improved thermal stability thereof including inhibition of agglomeration and inversion; and (d) patterning said nitrogen-enriched conductive layer, layer of doped polysilicon and gate oxide film to form a gate electrode structure.

8. A method according to claim 7, wherein said nitrogen-enriched conductive layer comprises a nitrogen-enriched metal silicide.

9. A method according to claim 7, wherein said nitrogen-enriched conductive layer comprises a nitrogen-enriched refractory metal.

10. A method according to claim 7, wherein step (d) comprises sputter depositing using a sputter process plasma.

11. A method according to claim 10, further comprising the step of incorporating nitrogen into said sputter process plasma to form a nitrogen-enriched sputter process plasma.

12. A method according to claim 10, wherein said sputter process plasma includes argon.

* * * * *